(12) United States Patent
Do et al.

(10) Patent No.: US 8,319,296 B2
(45) Date of Patent: Nov. 27, 2012

(54) SEMICONDUCTOR DEVICE INCLUDING CARBON-CONTAINING ELECTRODE AND METHOD FOR FABRICATING THE SAME

(75) Inventors: Kwan-Woo Do, Gyeonggi-do (KR);
Kee-Jeung Lee, Gyeonggi-do (KR);
Young-Dae Kim, Gyeonggi-do (KR);
Mi-Hyoung Lee, Gyeonggi-do (KR);
Jeong-Yeop Lee, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 359 days.

(21) Appl. No.: 12/648,337

(22) Filed: Dec. 29, 2009

(65) Prior Publication Data
US 2011/0128667 A1    Jun. 2, 2011

(30) Foreign Application Priority Data

Nov. 30, 2009 (KR) .................. 10-2009-0117394

(51) Int. Cl.
*H01L 29/78* (2006.01)
*H01L 21/28* (2006.01)

(52) U.S. Cl. ................. 257/412; 257/E29.165; 438/605

(58) Field of Classification Search .................. 257/412, 257/E29.111, E29.163, E29.165; 438/605
See application file for complete search history.

(56) References Cited

U.S. PATENT DOCUMENTS

| | | | |
|---|---|---|---|
| 5,965,911 A * | 10/1999 | Joo et al. | 257/288 |
| 6,271,558 B1 | 8/2001 | Sandhu et al. | |
| 7,193,253 B2 * | 3/2007 | Doczy et al. | 257/249 |
| 7,851,915 B2 * | 12/2010 | Caubet et al. | 257/751 |

FOREIGN PATENT DOCUMENTS
EP    0818559    1/1998

OTHER PUBLICATIONS

Notice of Preliminary Rejection issued from Korean Intellectual Property Office on Jun. 23, 2011.

* cited by examiner

*Primary Examiner* — William D Coleman
(74) *Attorney, Agent, or Firm* — IP & T Group LLC

(57) ABSTRACT

In a semiconductor device including a carbon-containing electrode and a method for fabricating the same, an electrode has a high work function due to a carbon-containing TiN layer contained therein. It is possible to provide a dielectric layer having a high permittivity and thus to reduce the leakage current by forming an electrode having a high work function. Also, sufficient capacitance of a capacitor can be secured by employing an electrode having a high work function and a dielectric layer having a high permittivity.

31 Claims, 3 Drawing Sheets

SEMICONDUCTOR DEVICE INCLUDING CARBON-CONTAINING ELECTRODE AND METHOD FOR FABRICATING THE SAME

CROSS-REFERENCE TO RELATED APPLICATIONS

The present application claims priority of Korean Patent Application No(s). 10-2009-0117394, filed on Nov. 30, 2009, which is incorporated herein by reference in its entirety.

BACKGROUND OF THE INVENTION

Exemplary embodiments of the present invention relate to semiconductor fabricating technology, and more particularly, to a semiconductor device including a carbon-containing electrode, and a method for fabricating the semiconductor device.

In effecting the structural scale-down to increase the number of semiconductor chips per wafer in a process of fabricating a semiconductor dynamic random access memory (DRAM), capacitances of a device are also decreased due to the structural reduction of capacitors of the DRAM.

To overcome the drawback, i.e., to increase the capacitance, a dielectric layer having a high permittivity is being used. However, the dielectric layer having the high permittivity has a problem in that the leakage current is high due to a narrow band gap. Therefore, an electrode having a high work function is needed to solve the problem.

SUMMARY OF THE INVENTION

An embodiment of the present invention is directed to a semiconductor device having a carbon-containing electrode having a high work function, and a method for fabricating the semiconductor device.

In accordance with an embodiment of the present invention, an electrode of a semiconductor device includes a titanium nitride (TiN) layer containing a carbon element.

The carbon element may have a content of approximately 3% to approximately 50% within the TiN layer containing the carbon element or more preferably, a content of approximately 20% to approximately 50% within the TiN layer containing the carbon element.

The TiN layer containing the carbon element may include at least one compound selected from the group consisting of TiCN, TiSiCN, TiAlCN and TiSiAlCN and may include at least one electrode selected from the group consisting of a gate electrode, a bit line electrode, a lower electrode of a capacitor and an upper electrode of a capacitor.

In accordance with another embodiment of the present invention, a method for forming a TiN layer includes providing a substrate, and depositing a TiN layer containing a carbon element over the substrate.

The TiN layer containing the carbon element may be formed through an atomic layer deposition (ALD) method that may repeat a unit cycle including a combination of flowing a titanium organic source and purging, flowing a silicon or aluminum source and a purging, and flowing plasma and purging and be performed at a temperature of approximately 150° C. to approximately 500° C.

The ALD method may control the content of the carbon element within the TiN layer containing the carbon element by controlling flowing the titanium organic source or flowing the plasma. The control of flowing the titanium organic source may be performed by controlling a titanium organic source flowing time or a flowing amount of the titanium organic source. The control of flowing of the plasma may be performed by controlling a processing time of flowing the plasma or a power in flowing the plasma.

The titanium organic source may include at least one compound selected from the group consisting of TDMAT[Tetrakis(dimethylamino)titanium], TEMAT [Tetrakis(ethylmethylamino)titanium], TDEAT[Tetrakis[diethylamino] titanium], $Ti(OiPr)_2(tmhd)_2$[Bis(isopropoxy)Di(2,2,6,6-Tetra methyl-3,5-heptane dionato)TiTanium], $Ti(OiBu)_2$ $(tmhd)_2$[Di(tert-butoxy)Bis(2,2,6,6-tetramethyl-3,5-heptane dionato)Titanium], $Ti(OiBu)_4$[Titanium(VI) Tert-Butoxide] TTIP[Titanium(IV) Isopropoxide] and $TiCl_4$[Titanium tetrachloride].

The flowing of the plasma may be performed using a processing gas selected from the group consisting of $N_2$, Ar, $H_2$ and $NH_3$.

In accordance with yet another embodiment of the present invention, a capacitor includes a first electrode, a dielectric layer, and a second electrode, wherein at least one of the first and second electrodes include a TiN layer containing a carbon element.

In accordance with still another embodiment of the present invention, a method for forming a capacitor includes forming a first electrode, forming a dielectric layer over the first electrode, and forming a second electrode over the dielectric layer, wherein at least one of the first and second electrodes include a TiN layer containing a carbon element.

DESCRIPTION OF THE INVENTION

Figure 1:
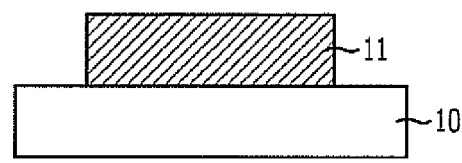
FIG. 1 is a cross-sectional view illustrating a titanium nitride layer containing a carbon element in accordance with an embodiment of the present invention.

Exemplary embodiments of the present invention are described below in more detail with reference to the accompanying drawings. The present invention may, however, be embodied in different forms and should not be constructed as being limited to the embodiments set forth herein. Rather, these embodiments are provided so that this disclosure will be thorough and complete, and will fully convey the scope of embodiments of the present invention to those skilled in the art. Throughout the disclosure, like reference numerals refer to like parts throughout the various drawing figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention provide a semiconductor device having a carbon-containing electrode and a method for fabricating the same. The electrode of the semiconductor device is formed of a titanium nitride layer which is formed to contain a carbon element to thereby achieve a high work function. As a result, although a dielectric layer having a high permittivity is employed in the semiconductor device to form a capacitor, the leakage current of the semiconductor device is reduced. A method for forming the titanium nitride layer containing the carbon element for the above purpose is described in detail hereinafter.

FIG. 1 is a cross-sectional view illustrating a titanium nitride (TiN) layer containing a carbon (C) element in accordance with an embodiment of the present invention.

As described in FIG. 1, the TiN layer containing the carbon element, i.e., the carbon-containing TiN layer 11, is formed on a substrate 10. Herein, the carbon-containing TiN layer 11 includes an electrode of a semiconductor device. For instance, the carbon-containing TiN layer 11 can include at least one of a gate electrode, a bit line electrode, a lower electrode of a capacitor and an upper electrode of the capacitor.

The carbon-containing TiN layer 11 may include at least one compound selected from the group consisting of TiCN, TiSiCN, TiAlCN and TiSiAlCN. Specially, the content of the carbon element may be in a range of 3% to 50% of the total content of the carbon-containing TiN layer 11.

Carbon has a work function of 5 eV, and a typical TiN layer has a work function of 4.5 eV. Therefore, it is possible to increase the height of a Schottky barrier and to reduce the leakage current by forming the carbon-containing TiN layer 11 by doping carbon having a relatively high work function.

Table 1 below compares the work function of TiN layers containing no carbon element with that of the carbon-containing TiN layer in accordance with an embodiment of the present invention.

TABLE 1

|  | TiN | TiSiN | TiAlN | TiSiCN, TiAlCN |
|---|---|---|---|---|
| Work function (eV) | ~4.5 | ~4.7 | ~4.8 | ≧4.9 |

As described in Table 1, among the TiN layers containing no carbon element, the TiN layer has a work function of 4.5 eV, and the TiSiN and TiAlN layers have a work function in a range of 4.7 eV to 4.8 eV. On the other hand, the carbon-containing TiN layer in accordance with the embodiment of the present invention has a work function of at least 4.9 eV. Therefore, the work function of the carbon-containing TiN layer is at least 0.1 eV higher than those of the TiN layers containing no carbon element.

In accordance with the embodiment of the present invention, it is possible to obtain a carbon-containing TiN layer 11 having a higher work function by forming a carbon-containing TiN layer 11 including at least one compound selected from the group consisting of TiSiCN, TiAlCN and TiSiAlCN, obtained by doping carbon to TiSiN or TiAlN having a relatively high work function. Moreover, the carbon-containing TiN layer 11 may be formed of a TiCN layer not including Si or Al.

As described above, if the work function increases, it is possible to increase the height of the Schottky barrier and to thus reduce the leakage current.

The carbon-containing TiN layer 11 may be formed using an atomic layer deposition (ALD) method. Preferably, the carbon-containing TiN layer 11 may be formed using a metal organics ALD method. This is described in detail below with reference to a timing diagram illustrated in FIG. 2.

Figure 2:
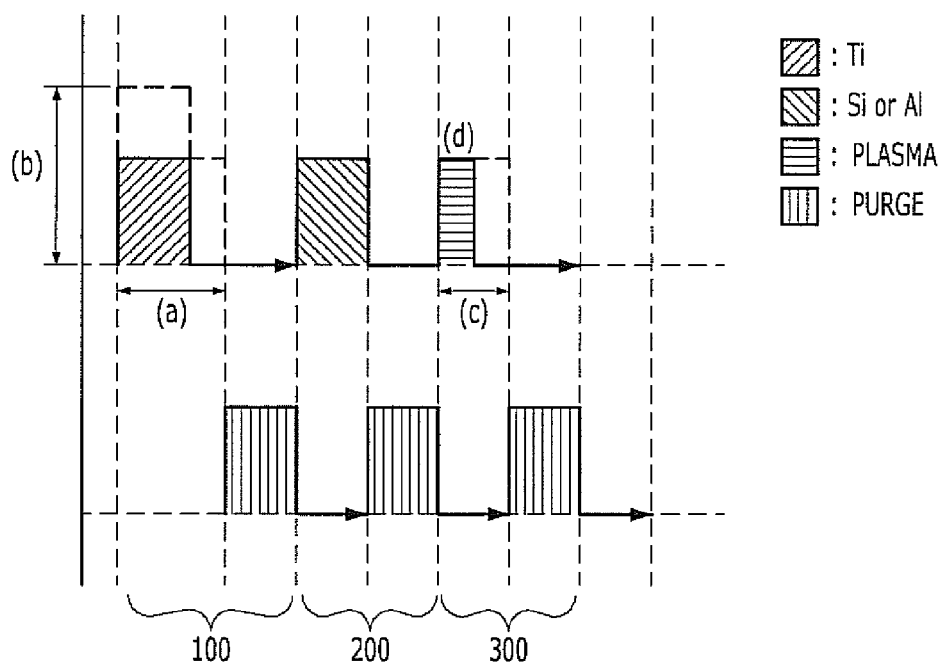
FIG. 2 is a timing diagram of an atomic layer deposition method for forming the titanium nitride layer containing the carbon element.

FIG. 2 is the timing diagram of the ALD method for forming the carbon-containing TiN layer.

The ALD method is a method of sequentially flowing a source material and a reaction material into a chamber and purging the materials to sequentially deposit a plurality of monoatomic layers.

While the ALD method uses a chemical reaction like a chemical vapor deposition (CVD) method, it is distinguished from the CVD method in an aspect that each reaction source flows as a pulse without being mixed in the chamber. For instance, the flowing of the source material, the purge, the flowing of the reaction material and the purge are sequentially performed. For example, after accomplishing the chemical absorption by flowing the source material, a non-reacted source material remaining in the chamber is purged with an inert gas. After that, when flowing the reaction material into the chamber, the reaction between the source material and the reaction material occurs, and thus an atomic layer thin film is deposited. Lastly, after the reaction between the source material and the reaction material, the reaction material and by-products remaining in the chamber are purged.

As described above, since the ALD method uses a surface reaction mechanism, it is possible to secure a uniform stabilized thin film. Moreover, according the ALD method, since the source material is separated from the reaction material and since they are sequentially flowed and purged, it is possible to suppress the generation of particles due to the gas phase reaction, which occur with the CVD method.

As shown in FIG. 2, the ALD method repeats a unit cycle M times, M being a natural number, wherein the unit cycle includes a combination of a step 100 of flowing a titanium organic source and purging, a step 200 of flowing a silicon or aluminum source and purging, and a step 300 of flowing a plasma and purging.

In particular, the ALD method repeats a unit cycle M times, a unit cycle including the step 100 (Ti/purge), a unit cycle including the steps 100 and 200 (Ti/purge/Si or Al/purge), a unit cycle including the steps 100 and 300 (Ti/purge/plasma/purge), and a unit cycle including the steps 100, 200 and 300 (Ti/purge/Si or Al/purge/plasma/purge). A carbon-containing TiN layer formed by repeating 'A' unit cycles including the step 100 or the unit cycle including the steps 100 and 300, 'A' being a natural number, includes TiCN. A carbon-containing TiN layer formed by repeating 'B' unit cycles including the steps 100 and 200 or the unit cycle including the steps 100 and 300, 'B' being a natural number, includes at least one compound selected from the group consisting of TiSiCN, TiAlCN and TiSiAlCN. That is, a carbon-containing TiN layer is formed, the carbon-containing TiN layer being selected from the group consisting of TiCN, TiSiCN, TiAlCN and TiSiAlCN through the combination of the above-noted unit cycles.

The flowing of the titanium organic source delivers the titanium organic source into the chamber where a substrate on which the TiN layer is to be deposited is disposed. Herein, the titanium organic source is absorbed on the surface of the substrate. The titanium organic source includes a titanium source using methylamino. That is, the titanium organic source may include at least one compound selected from the group consisting of TDMAT[Tetrakis(dimethylamino)titanium], TEMAT [Tetrakis(ethylmethylamino)titanium], TDEAT[Tetrakis[diethylamino]titanium], Ti(OiPr)$_2$(tmhd)$_2$ [Bis(isopropoxy)Di(2,2,6,6-Tetra methyl-3,5-heptane dionato)TiTanium], Ti(OiBu)$_2$(tmhd)$_2$[Di(tert-butoxy)Bis(2,2,6, 6-tetramethyl-3,5-heptane dionato)Titanium], Ti(OiBu)$_4$

[Titanium(VI) Tert-Butoxide]TTIP[Titanium(IV) Isopropoxide] and TiCl₄[Titanium tetrachloride], and may be supplied at a flow rate of 100 sccm to 3000 sccm for 1 second to 20 seconds. A carrier gas for carrying the titanium organic source may be He or $N_2$.

The substrate where the TiN layer is to be deposited may include a silicon (Si) substrate, a silicon oxide ($SiO_2$) layer, a metal layer or a dielectric layer having a high permittivity. The carbon-containing TiN layer may include at least one of a gate electrode, a bit line electrode, a lower electrode of a capacitor and an upper electrode of the capacitor. A deposition temperature for a process of depositing a metal organic atomic layer is a relatively low temperature of 150° C. to 500° C. If the deposition temperature is lower than 150° C., the titanium organic source is not absorbed on the surface of the substrate. Meanwhile, if the deposition temperature is higher than 500° C., the substrate is damaged by the high temperature.

In accordance with an embodiment of the present invention, the flowing of the titanium organic source can be adjusted to form the carbon-containing TiN layer. The content of the carbon element in the carbon-containing TiN layer can be controlled by adjusting a flowing time 'a' and a flowing amount 'b' of the titanium organic source. That is, the flowing time 'a' of the titanium organic source may be controlled in a range of 1 second to 20 seconds, and the flowing amount 'b' may be controlled in a flow rate range of 100 sccm to 3000 sccm.

Then, the purging is performed to remove the titanium organic source remaining after the absorbing reaction. Herein, an inert gas that does not react with the titanium organic source is used as a purge gas. The purge gas may include a gas selected from the group consisting of $N_2$, Ar and He. The purging is performed for 1 second to 10 seconds using a flow rate of 100 sccm to 10000 sccm.

As described above, the TiCN layer is formed by repeating 'A' unit cycles including only the step 100 of flowing the titanium organic source and purging. If the titanium organic source includes C and N, then it is possible to form the carbon-containing TiN layer, even though the nitrogen plasma treatment is not performed. Although not shown, if the titanium organic source does not include N, then it is possible to form the TiCN layer by performing the flowing of the reaction gas using a nitrogen gas and purging.

Subsequently, in the flowing the Si or Al source, the Si or Al source is flowed for 1 second to 20 seconds using the carrier gas, e.g., He or $N_2$. Herein, the Si source includes at least one compound selected from the group consisting of TEMASi [Tetrakis(ethylmethylamino)Silicon], TDMASi[Tetrakis (dimethylamino)silicon], Tris-DMASiH[Tris(dimethylamino)silane], Tris-EMASiH-[Tris(ethylmethylamino) silane], TEOS[Tetrakis(ethoxy)Silane], HCDS[Hexchloro Disilane], TMDSO[1,1,3,3-Tetramethyl Disiloxane] and TMS[Tetramethyl silane]. The Al source includes at least one compound selected from the group consisting of MPA[1-Methyl Pyrrolidine Alane], MPTMA[1-Methylpyrrolidine TriMethylaluminum], TMA[Dimethyl aluminum hydride-Ethyl piperidine], DMAH-EPP[Dimethyl aluminum hydride-Ethyl piperidine] and TTBA[Tritertiarybutyl aluminum].

After that, the purging is performed using an inert purge gas. The inert gas may include at least one gas selected from the group consisting of $N_2$, Ar and He. The purging is performed for 1 second to 10 seconds using a purge gas having a flow rate of 100 sccm to 10000 sccm.

As described above, the carbon-containing TiN layer selected from the group consisting of TiSiCN, TiAlCN and TiSiAlCN is formed by repeating 'B' unit cycles including flowing the titanium organic source and purging 100, and flowing the Si or Al source and purging 200. If the titanium organic source includes C and N, then it is possible to form the carbon-containing TiN layer even though the nitrogen plasma treatment is not performed. If the titanium organic source does not include N, then it is possible to form the carbon-containing TiN layer by performing flowing the reaction gas using a nitrogen gas and the purging.

Subsequently, the plasma flowing is performed. The plasma flowing may be performed through a direct plasma treatment or the remote plasma treatment. In this embodiment of the present invention, it is assumed that the plasma flowing is performed through the remote plasma treatment. When using the remote plasma treatment, it is possible to prevent the substrate from being physically damaged by the plasma. A gas for generating the plasma may include a gas selected from the group consisting of $N_2$, $H_2$ and $NH_3$, the gas being supplied at a flow rate of 100 sccm to 3000 sccm, and flowed for 0 second to 30 seconds. Herein, 0 second means that the plasma flowing is not performed, and corresponds to a case in which the unit cycle including the step 100 or the unit cycle including the steps 100 and 200 is performed.

Particularly, in this embodiment, the plasma treatment can be controlled to form the carbon-containing TiN layer. Herein, the content of the carbon element in the carbon-containing TiN layer may be controlled by adjusting a plasma treatment time 'c' and a power 'd'. That is, the processing time 'c' of the plasma treatment gas, i.e., a plasma generating gas, is adjusted within a range of 0 second to 30 seconds.

Finally, the purging is the purging by-products and the reaction material remaining after the reaction. The purging uses an inert purge gas. The inert gas may include a gas selected from the group consisting of $N_2$, Ar and He. The purging is performed by supplying the purge gas at a flow rate of 100 sccm to 10000 sccm for 1 second to 10 seconds.

As described above, the carbon-containing TiN layer selected from the group consisting of TiCN, TiSiCN, TiAlCN and TiSiAlCN can be formed by properly maintaining the carbon attached to the titanium metal organic source within the thin film through the control of the plasma treatment power 'd', the plasma treatment time 'c', and the flowing amount 'b' and the flowing time 'a' of the titanium organic source. Specially, if the titanium metal organic source does not include N, a gas generating the plasma may use $N_2$ or $NH_3$.

The increase of the flowing amount 'b' and the flowing time 'a' of the titanium organic source increases a thickness of the titanium source deposited per unit time and the concentration per unit area of carbon molecules that the titanium metal organic source includes. Since the carbon is controlled through the subsequent plasma treatment, if the concentration of the carbon per unit area during the plasma treatment time 'c' increases, the carbon remains without being removed by the plasma treatment, and thus the concentration of the carbon within the thin film may increase. Moreover, when increasing the plasma treatment time 'c' and the plasma treatment power 'd' during the source flowing time and the flowing concentration are fixed, an amount of the carbon molecules within the thin film that are activated and separated increases, and thus the concentration of the carbon within the thin film decreases.

Table 2 represents the variation of the carbon element within the thin film according to each condition.

TABLE 2

| Variable | Variation | Carbon amount in Thin film | Work function |
|---|---|---|---|
| Source flowing time | Increase | Increase | Increase |
| Source flowing time | Decrease | Decrease | Decrease |
| Source flowing amount | Increase | Increase | Increase |
| Source flowing amount | Decrease | Decrease | Decrease |
| Plasma treatment time | Increase | Decrease | Decrease |
| Plasma treatment time | Decrease | Increase | Increase |
| Plasma treatment power | Increase | Decrease | Decrease |
| Plasma treatment power | Decrease | Increase | Increase |

Referring to Table 2, there are 4 conditions capable of controlling the carbon amount within the thin film, and the source flowing time and the source flowing amount are proportional to the carbon amount within the thin film and the variation of the work function. The plasma treatment time and the plasma treatment power are inversely proportional to the carbon amount within the thin film and the work function.

Comparing the carbon amount within the thin film with the variation of the work function based on the increase and decrease of the carbon amount, it has been verified that the work function also increases as the carbon concentration within the thin film increases. Therefore, the carbon amount within the thin film increases, and the work function increases, as the source flowing time and the source flowing amount increases and the plasma treatment time and power decreases.

Figure 3A:
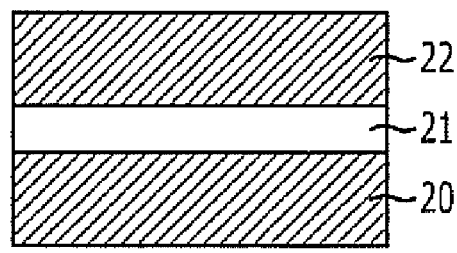
FIGS. 3A to 3C illustrate cross-sectional views of capacitors having electrodes formed of a titanium nitride layer in accordance with embodiments of the present invention.
Figure 3B:
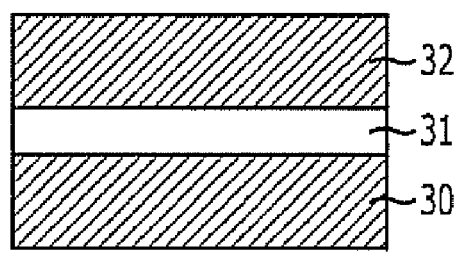
Figure 3C:
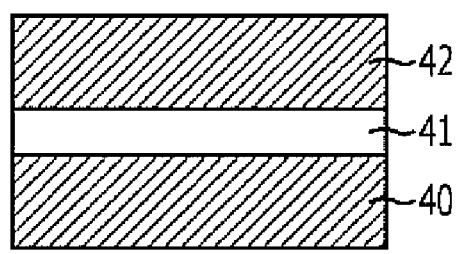

FIGS. 3A to 3C illustrate cross-sectional views of capacitors having electrode(s) formed of a TiN layer in accordance with an embodiment of the present invention. For the simplicity of explanation, the embodiment shows a lower electrode of the capacitor having a plate shape. However, the lower electrode is not limited thereto, and the lower electrode may include a shape selected from concave, cylinder and pillar shapes in addition to the plate shape.

Referring to FIG. 3A, in a capacitor constructed with a lower electrode 20, a dielectric layer 21 and an upper electrode 22 that are stacked, the lower electrode 20 is formed of a TiN layer containing a carbon element, i.e., a carbon-containing TiN layer. For instance, the lower electrode 20 includes a carbon-containing TiN layer selected from the group consisting of TiCN, TiSiCN, TiAlCN and TiSiAlCN. Herein, a carbon element has a content of 3% to 50% and, preferably, 20% to 50%, within the carbon-containing TiN layer. The lower electrode 20 may be formed using the ALD method described above with regard to FIG. 2.

The dielectric layer 21 may be formed of a layer having a high permittivity. For instance, the dielectric layer 21 may include a dielectric layer having a high permittivity selected from the group consisting of $ZrO_2$, $ZrSiO_2$, $ZrTiO_3$, $ZrYO_2$, $ZrLaO_2$, $ZrAlO_2$, $HfO_2$, $HfSiO_2$, $HfYO_2$, $HfAlO_2$, HfSiON, $TiO_2$, $AlTiO_2$, $SrTiO_3$ and $BaSrTiO_3$.

Referring to FIG. 3B, in a capacitor constructed with a lower electrode 30, a dielectric layer 31 and an upper electrode 32 that are stacked, the upper electrode 32 is formed of a carbon-containing TiN layer. For instance, the upper electrode 32 includes a carbon-containing TiN layer selected from the group consisting of TiCN, TiSiCN, TiAlCN and TiSiAlCN. Herein, a carbon element has a content of 3% to 50% and, preferably, 20% to 50%, within the carbon-containing TiN layer. The upper electrode 32 may be formed using the ALD method described above with regard to FIG. 2.

The dielectric layer 31 may be formed of a layer having a high permittivity. For instance, the dielectric layer 21 may include a dielectric layer having a high permittivity selected from the group consisting of $ZrO_2$, $ZrSiO_2$, $ZrTiO_3$, $ZrYO_2$, $ZrLaO_2$, $ZrAlO_2$, $HfO_2$, $HfSiO_2$, $HfYO_2$, $HfAlO_2$, HfSiON, $TiO_2$, $AlTiO_2$, $SrTiO_3$ and $BaSrTiO_3$.

Referring to FIG. 3C, in a capacitor constructed with a lower electrode 40, a dielectric layer 41 and an upper electrode 42 that are stacked, the lower electrode 40 and the upper electrode 42 are formed of a carbon-containing TiN layer. For instance, the lower electrode 40 and the upper electrode 42 include a carbon-containing TiN layer selected from the group consisting of TiCN, TiSiCN, TiAlCN and TiSiAlCN. Herein, a carbon element has a content of 3% to 50% and, preferably, 20% to 50%, within the carbon-containing TiN layer. The lower electrode 40 and the upper electrode 42 may be formed using the ALD method described above with regard to FIG. 2. Specially, in case of forming the upper electrode 42 with the carbon-containing TiN layer, a TiN layer may be stacked for the electrical connection although it is not shown.

The dielectric layer 41 may be formed of a layer having a high permittivity. For instance, the dielectric layer 21 may include a dielectric layer having a high permittivity selected from the group consisting of $ZrO_2$, $ZrSiO_2$, $ZrTiO_3$, $ZrYO_2$, $ZrLaO_2$, $ZrAlO_2$, $HfO_2$, $HfSiO_2$, $HfYO_2$, $HfAlO_2$, HfSiON, $TiO_2$, $AlTiO_2$, $SrTiO_3$ and $BaSrTiO_3$.

Figure 4A:
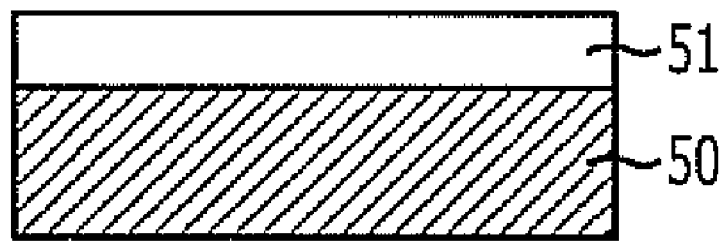
FIGS. 4A and 4B illustrate a method for fabricating a capacitor in accordance with an embodiment of the present invention.
Figure 4B:
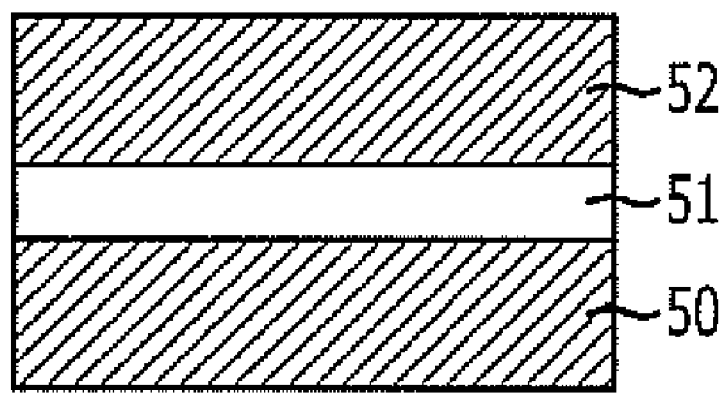

FIGS. 4A and 4B illustrate a method for fabricating a capacitor in accordance with an embodiment of the present invention.

Referring to FIG. 4A, a lower electrode 50 is formed, and a dielectric layer 51 is formed on the lower electrode 50. The lower electrode 50 may be formed of a carbon-containing TiN layer. The carbon-containing TiN layer may include at least one compound selected from the group consisting of TiCN, TiSiCN, TiAlCN and TiSiAlCN. A carbon element has a content of 3% to 50% and, preferably, 20% to 50%, within the carbon-containing TiN layer. The carbon-containing TiN layer has a work function greater than 4.9 eV. Therefore, it is possible to increase the height of a Schottky barrier and thus to reduce the leakage current.

For the simplicity of explanation, the lower electrode 50 is described as having a plate shape. However, the lower electrode 50 is not limited thereto. The lower electrode 50 may include a shape selected from concave, cylinder and pillar shapes.

The lower electrode 50 may be formed using the ALD method described above with regard to FIG. 2.

The dielectric layer 51 may be formed of a layer having a high permittivity. For instance, the dielectric layer 51 may include a dielectric layer having a high permittivity selected from the group consisting of $ZrO_2$, $ZrSiO_2$, $ZrTiO_3$, $ZrYO_2$, $ZrLaO_2$, $ZrAlO_2$, $HfO_2$, $HfSiO_2$, $HfYO_2$, $HfAlO_2$, HfSiON, $TiO_2$, $AlTiO_2$, $SrTiO_3$ and $BaSrTiO_3$.

Referring to FIG. 4B, an upper electrode 52 is formed on the dielectric layer 51. The upper electrode 52 may be formed of the same material as that of the lower electrode 50, i.e., the carbon-containing TiN layer. The carbon-containing TiN layer may include at least one compound selected from the group consisting of TiCN, TiSiCN, TiAlCN and TiSiAlCN. A carbon element has a content of 3% to 50% and, preferably, 20% to 50%, within the carbon-containing TiN layer.

Especially, in case of forming the upper electrode 52 with the carbon-containing TiN layer, a TiN layer may be further formed for the electrical connection.

In accordance with the embodiments of the present invention, the semiconductor device includes a carbon-containing electrode and the method for fabricating the same includes an electrode having a high work function by forming the carbon-containing TiN layer.

Moreover, it is possible to provide a dielectric layer having a high permittivity and thus reduce the leakage current by forming an electrode having a high work function.

Furthermore, it is possible to secure sufficient capacitance of a capacitor by employing an electrode having a high work function and a dielectric layer having a high permittivity.

While the present invention has been described with respect to specific embodiments, it will be apparent to those skilled in the art that various changes and modifications may be made without departing from the spirit and scope of the present invention as defined by the following claims.

What is claimed is:

1. An electrode of a semiconductor device, the electrode comprising:
   a substrate; and
   a titanium nitride (TiN) layer containing a carbon element, the TiN layer being arranged over the substrate,
   wherein the TiN layer containing the carbon element comprises at least one compound selected from the group consisting of TiSiCN, TiAlCN and TiSiAlCN.

2. The electrode of claim 1, wherein the carbon element has a content of approximately 3% to approximately 50% within the TiN layer containing the carbon element.

3. The electrode of claim 1, wherein the carbon element has a content of approximately 20% to approximately 50% within the TiN layer containing the carbon element.

4. The electrode of claim 1, wherein the TiN layer containing the carbon element comprises at least one electrode selected from the group consisting of a gate electrode, a bit line electrode, a lower electrode of a capacitor and an upper electrode of a capacitor.

5. A method for forming a TiN layer, the method comprising:
   providing a substrate; and
   depositing a TiN layer containing a carbon element over the substrate,
   wherein the TiN layer containing the carbon element comprises at least one compound selected from the group consisting of TiSiCN, TiAlCN and TiSiAlCN.

6. The method of claim 5, wherein the carbon element has a content of approximately 3% to approximately 50% within the TiN layer containing the carbon element.

7. The method of claim 5, wherein the carbon element has a content of approximately 20% to approximately 50% within the TiN layer containing the carbon element.

8. The method of claim 5, wherein the TiN layer containing the carbon element is formed through an atomic layer deposition (ALD) method.

9. The method of claim 5, wherein the TiN layer containing the carbon element is formed into at least one electrode selected from the group consisting of a gate electrode, a bit line electrode, a lower electrode of a capacitor and an upper electrode of a capacitor.

10. The method of claim 8, wherein the ALD method repeats a unit cycle including a combination of flowing a titanium organic source and purging, flowing a silicon or aluminum source and purging, and flowing a plasma and purging.

11. The method of claim 10, wherein the ALD method controls the content of the carbon element within the TiN layer containing the carbon element by controlling the flowing of the titanium organic source or the flowing of the plasma.

12. The method of claim 10, wherein the titanium organic source comprises at least one compound selected from the group consisting of
   TDMAT[Tetrakis(dimethylamino)titanium], TEMAT[Tetrakis(ethylmethylamino) titanium], TDEAT[Tetrakis[diethylamino]titanium],
   $Ti(OiPr)_2(tmhd)_2$[Bis(isopropoxy)Di(2,2,6,6-Tetramethyl-3,5-heptane dionato) TiTanium],
   $Ti(OiBu)_2(tmhd)_2$[Di(tert-butoxy)Bis(2,2,6,6-tetramethyl-3,5-heptane dionato) Titanium],
   $Ti(OiBu)_4$[Titanium(VI)Tert-Butoxide]TTIP[Titanium(IV)Isopropoxide] and
   $TiCl_4$[Titanium tetrachloride].

13. The method of claim 10, wherein the flowing of the plasma is performed using a processing gas selected from the group consisting of $N_2$, Ar, $H_2$ and $NH_3$.

14. The method of claim 11, wherein the control of the flowing of the titanium organic source is performed by controlling a titanium organic source flowing time.

15. The method of claim 11, wherein the control of the flowing of the titanium organic source is performed by controlling a flowing amount of the titanium organic source.

16. The method of claim 11, wherein the control of the flowing of the plasma is performed by controlling a processing time of the flowing of the plasma.

17. The method of claim 11, wherein the control of the flowing of the plasma is performed by controlling a power in the flowing of the plasma.

18. A capacitor, comprising:
   a first electrode;
   a dielectric layer; and
   a second electrode, wherein at least one of the first and second electrodes include a TiN layer containing a carbon element,
   wherein the TiN layer containing the carbon element comprises at least one compound selected from the group consisting of TiSiCN, TiAlCN and TiSiAlCN.

19. The capacitor of claim 18, wherein the carbon element has a content of approximately 3% to approximately 50% within the electrode.

20. The capacitor of claim 18, wherein the carbon element has a content of approximately 20% to approximately 50% within the TiN layer containing the carbon element.

21. A method for forming a capacitor, the method comprising:
   forming a first electrode;
   forming a dielectric layer over the first electrode; and
   forming a second electrode over the dielectric layer, wherein at least one of the first and second electrodes includes a TiN layer containing a carbon element,
   wherein the TiN layer containing the carbon element comprises at least one compound selected from the group consisting of TiSiCN, TiAlCN and TiSiAlCN.

22. The method of claim 21, wherein the carbon element has a content of approximately 3% to approximately 50% within the TiN layer containing the carbon element.

23. The method of claim 21, wherein the carbon element has a content of approximately 20% to approximately 50% within the TiN layer containing the carbon element.

24. The method of claim 21, wherein the TiN layer containing the carbon element is formed using an atomic layer deposition (ALD) method.

25. The method of claim 24, wherein the ALD method repeats a unit cycle including a combination of flowing a titanium organic source and purging, flowing a silicon or aluminum source and purging, and flowing plasma and purging.

26. The method of claim 25, wherein the ALD method controls the content of the carbon element within the TiN layer containing the carbon element by controlling the flowing of the titanium organic source or flowing the plasma.

27. The method of claim 25, wherein the flowing of the plasma is performed using a processing gas selected from the group consisting of $N_2$, Ar, $H_2$ and $NH_3$.

28. The method of claim 26, wherein the control of the flowing of the titanium organic source is performed by controlling a titanium organic source flowing time.

29. The method of claim 26, wherein the control of the flowing of the titanium organic source is performed by controlling a flowing amount of the titanium organic source.

30. The method of claim 26, wherein the control of the flowing of the plasma is performed by controlling a processing time of the flowing of the plasma.

31. The method of claim 26, wherein the control of the flowing of the plasma is performed by controlling a power in the flowing of the plasma.

* * * * *